(12) United States Patent
Narushima et al.

(10) Patent No.: US 10,221,478 B2
(45) Date of Patent: Mar. 5, 2019

(54) FILM FORMATION DEVICE

(71) Applicant: TOKYO ELECTRON LIMITED, Tokyo (JP)

(72) Inventors: Kensaku Narushima, Nirasaki (JP); Daisuke Toriya, Nirasaki (JP); Kentaro Asakura, Nirasaki (JP); Seishi Murakami, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 457 days.

(21) Appl. No.: 14/787,860

(22) PCT Filed: Feb. 10, 2014

(86) PCT No.: PCT/JP2014/000693
§ 371 (c)(1),
(2) Date: Oct. 29, 2015

(87) PCT Pub. No.: WO2014/178160
PCT Pub. Date: Nov. 6, 2014

(65) Prior Publication Data
US 2016/0083837 A1 Mar. 24, 2016

(30) Foreign Application Priority Data

Apr. 30, 2013 (JP) .................... 2013-095548
Apr. 30, 2013 (JP) .................... 2013-095558

(51) Int. Cl.
*H01L 21/67* (2006.01)
*H01J 37/32* (2006.01)
(Continued)

(52) U.S. Cl.
CPC ......... *C23C 16/4408* (2013.01); *C23C 16/34* (2013.01); *C23C 16/4405* (2013.01);
(Continued)

(58) Field of Classification Search
CPC ............ C23C 16/4405; C23C 16/4408; C23C 16/4409; C23C 16/4412; C23C 16/44544; C23C 16/4583; C23C 16/4585
(Continued)

(56) References Cited

U.S. PATENT DOCUMENTS 5,273,588 A * 12/1993 Foster ................. C23C 16/455
118/715
5,558,717 A * 9/1996 Zhao .................. C23C 16/4401
118/715
(Continued)

FOREIGN PATENT DOCUMENTS

CN 101772833 A 7/2010
JP 2-97013 A 4/1990
(Continued)

OTHER PUBLICATIONS

International Search Report dated Apr. 22, 2014 corresponding to International application No. PCT/JP2014/000693.

*Primary Examiner* — Charlee J C Bennett
(74) *Attorney, Agent, or Firm* — Nath, Goldberg & Meyer; Jerald L. Meyer

(57) ABSTRACT

A film formation device includes: a processing vessel; a mounting stand installed within the processing vessel and configured to mount a substrate thereon; an elevating shaft installed so as to extend in an up-down direction while supporting the mounting stand and connected to an external elevator mechanism through a through-hole formed in the processing vessel; a bellows installed between the processing vessel and the elevator mechanism and configured to cover a periphery of the elevating shaft at a lateral side of the elevating shaft; a lid member disposed so as to surround the elevating shaft with a gap left between a lateral circumferential surface of the elevating shaft and the lid member; and a purge gas supply part configured to supply a purge gas into the bellows so that a gas flow from the bellows toward the processing vessel through the gap is formed.

17 Claims, 13 Drawing Sheets

(51) Int. Cl.
*C23C 16/458* (2006.01)
*C23C 16/44* (2006.01)
*H01L 21/687* (2006.01)
*C23C 16/34* (2006.01)
*C23C 16/455* (2006.01)

(52) U.S. Cl.
CPC ...... *C23C 16/4409* (2013.01); *C23C 16/4412* (2013.01); *C23C 16/4583* (2013.01); *C23C 16/45544* (2013.01); *H01L 21/68742* (2013.01); *H01L 21/68792* (2013.01)

(58) Field of Classification Search
USPC .................................................. 118/715–733
See application file for complete search history.

(56) References Cited

U.S. PATENT DOCUMENTS

| | | | | |
|---|---|---|---|---|
| 6,673,196 | B1* | 1/2004 | Oyabu | H01J 37/32477 118/719 |
| 6,932,885 | B1* | 8/2005 | Oka | B01J 3/03 118/730 |
| 2003/0015138 | A1* | 1/2003 | Tometsuka | C23C 16/4401 118/715 |
| 2004/0262540 | A1* | 12/2004 | Nagaseki | H01L 21/67115 250/492.1 |
| 2005/0172905 | A1* | 8/2005 | Kaszuba | C23C 16/4401 118/728 |
| 2006/0191484 | A1* | 8/2006 | Mitrovic | C23F 4/00 118/729 |
| 2008/0023293 | A1* | 1/2008 | Uratani | B25J 9/041 198/346.2 |
| 2009/0314309 | A1* | 12/2009 | Sankarakrishnan | B08B 5/00 134/1.1 |
| 2010/0075035 | A1* | 3/2010 | Gomi | C23C 16/16 427/252 |
| 2010/0279008 | A1* | 11/2010 | Takagi | C23C 16/409 427/248.1 |
| 2015/0376780 | A1* | 12/2015 | Khaja | C23C 16/4405 134/1.1 |
| 2016/0319424 | A1* | 11/2016 | Takahashi | C23C 16/4412 |
| 2017/0067157 | A1* | 3/2017 | Ashihara | C23C 16/45565 |

FOREIGN PATENT DOCUMENTS

| | | | |
|---|---|---|---|
| JP | 07193050 A | * | 7/1995 |
| JP | 11-214317 A | | 8/1999 |
| JP | 11-302829 A | | 11/1999 |
| JP | 11302829 A | * | 11/1999 |
| JP | 2002-151489 A | | 5/2002 |
| JP | 2004-214314 A | | 7/2004 |
| JP | 2006049489 A | * | 2/2006 |
| JP | 2009-224775 A | | 10/2009 |
| KR | 10-2010-0124198 A | | 11/2010 |

\* cited by examiner

FILM FORMATION DEVICE

This is a National Phase Application filed under 35 U.S.C. 371 as a national stage of PCT/JP2014/000693, filed Feb. 10, 2014, an application claiming the benefit of Japanese Application No. 2013095548, filed Apr. 30, 2013, and Japanese Application No. 2013095558, filed Apr. 30, 2013, the content of each of which is hereby incorporated by reference in its entirety.

TECHNICAL FIELD

The present disclosure relates to a technique of restraining a reaction gas from reaching a bellows installed under a processing vessel within which film formation is performed to a substrate.

BACKGROUND

As methods of performing film formation to a substrate, e.g., a semiconductor wafer (hereinafter referred to as a "wafer"), there are known a chemical vapor deposition (CVD) method in which a wafer is disposed within a processing vessel kept in a vacuum atmosphere and a deposit is deposited on the wafer by allowing a reaction gas to react on the surface of the wafer, and an atomic layer deposition (ALD) method or a multi-layer deposition (MLD) method (hereinafter generically referred to as an ALD method) in which a deposit is deposited on a wafer by sequentially supplying plural kinds of mutually-reacting reaction gases to the wafer and allowing the reaction gases to be adsorbed onto the surface of the wafer.

Among film formation devices which perform these film formation processes, there is a single-wafer-type film formation device configured to perform a film formation process by mounting a workpiece wafer on a mounting stand one by one. In the single-wafer-type film formation device, the height position of the mounting stand may be moved up and down depending on the operation contents (e.g., the film formation process or the delivery of the wafer to and from an external transfer mechanism). At this time, from the viewpoint of dust prevention within a processing vessel, there may be a case where an elevator mechanism for the mounting stand is disposed outside the processing vessel. The mounting stand is connected to the elevator mechanism by an elevating shaft which protrudes out of the processing vessel through a through-hole formed in the processing vessel. A stretchable bellows is installed between an edge portion of the through-hole and the elevator mechanism, thereby keeping the processing vessel airtight and maintaining the interior of the processing vessel under a vacuum atmosphere.

If the through-hole is formed so as to have, e.g., a diameter which is approximately a dozen mm to several tens mm larger than the diameter of the elevating shaft, it is possible to avoid contact between components such as the elevating shaft and the processing vessel body. This facilitates assembly and maintenance. On the other hand, if a gap between the elevating shaft and the through-hole is large, a reaction gas may enter the interior of the bellows from the processing vessel. Thus, a reaction product tends to be deposited on the inner surface of the bellows. The bellows is deformed pursuant to the expansion and contraction thereof. At this time, if the reaction product is peeled off and particles are generated, there is a possibility that the particles become a contamination source of a wafer.

In this regard, for example, Patent document 1 discloses a film formation device which includes a substrate holding table configured to hold a substrate to be processed as a film formation target so that the substrate can rotationally move about a vertical axis and can move up and down. This film formation device has a configuration in which a space through which a rotating shaft connected to the substrate holding table moves up and down is sealed by a partition wall such as a bellows or the like. However, Patent Document 1 fails to disclose a detailed configuration of a partition wall that isolates the internal space of the processing vessel and the internal space of the bellows while keeping the substrate holding table rotationally movable and vertically movable.

PRIOR ART DOCUMENTS

Patent Documents

Patent Document 1: Japanese laid-open publication No. 2002-151489: Paragraph 0100 and FIG. 19

The present disclosure provides some embodiments of a film formation device capable of facilitating assembly and maintenance thereof and restraining a reaction gas from entering the interior of a bellows

SUMMARY

According to one embodiment of the present invention, there is provided a film formation device, including:

a processing vessel provided with a vacuum exhaust part and configured to perform a film formation process by supplying a reaction gas to a surface of a substrate under a vacuum atmosphere;

a mounting stand installed within the processing vessel and configured to mount the substrate thereon;

an elevating shaft installed so as to extend in an up-down direction while supporting the mounting stand at a lower surface side of the mounting stand and connected to an external elevator mechanism through a through-hole formed in the processing vessel;

a bellows installed between the processing vessel and the elevator mechanism and configured to cover a periphery of the elevating shaft at a lateral side of the elevating shaft;

a lid member disposed so as to surround the elevating shaft with a gap left between a lateral circumferential surface of the elevating shaft and the lid member and attached to the processing vessel over the entire circumference of the lid member so that communication between a space below the lid member and a space above the lid member is prevented in regions other than the gap; and a purge gas supply part configured to supply a purge gas into the bellows so that a gas flow from the bellows toward the processing vessel through the gap between the elevating shaft and the lid member is formed.

The film formation device may include the following configurations.

(a) A height dimension of an inner circumferential surface of the lid member which surrounds the elevating shaft through the gap is larger than a height dimension of an inner circumferential surface of the through-hole.

(b) The lid member includes a sleeve configured to increase the height dimension of the inner circumferential surface of the lid member which surrounds the elevating shaft.

(c) The mounting stand includes a heating part configured to heat the substrate, and a recess portion configured to increase a distance between the heating part and the lid member is formed on an upper surface of the lid member so that suppress a temperature rise of the lid member attributable to heat dissipation from the heating part is suppressed.

(d) The device further includes: a tubular member disposed between an outer circumferential surface of the lid member and an inner circumferential surface of the bellows and configured to extend more downward than a lower end portion of the lid member. The tubular member is disposed so that a gap is formed between an outer circumferential surface of the tubular member and the inner circumferential surface of the bellows, and the purge gas supply part is configured to supply the purge gas into the bellows from an upper position within the gap between the tubular member and the bellows.

(e) The device further includes: a surrounding member disposed so as to surround the mounting stand with a gap left between the surrounding member and a lateral circumferential surface of the mounting stand staying in a position where the film formation process is performed, and configured to divide an interior of the processing vessel into an upper processing space into which the reaction gas is supplied and a lower space; and a vacuum exhaust part configured to evacuate the interior of the processing vessel from the side of the processing space, wherein the purge gas flowing through the gap between the elevating shaft and the lid member is introduced into the lower space.

(f) The processing vessel includes a top plate portion configured to form, between the top plate portion and the mounting stand, a processing space in which the film formation process is performed by diffusing the reaction gas, and provided with a gas supply hole through which the reaction gas is supplied, and the elevator mechanism is configured to move the mounting stand up and down through the elevating shaft between a processing position which forms the processing space and a position which is lower than the processing position. The device further includes: a first cleaning gas supply part configured to supply a cleaning gas to an upper surface side of the mounting stand; and a second cleaning gas supply part configured to supply a cleaning gas to a lower surface side of the mounting stand along the elevating shaft.

(g) The device further includes: a control part configured to output a control signal so that the second cleaning gas supply part supplies the cleaning gas in a state in which the mounting stand is moved down to a position lower than the processing position. The control part is configured to output a control signal so that the second cleaning gas supply part supplies the cleaning gas in a state in which the mounting stand is moved up to the processing position. The device further includes: an upper inert gas supply part configured to supply an inert gas to the gas supply hole formed in the top plate portion, wherein the control part is configured to output a control signal so that, during the supply of the cleaning gas from the second cleaning gas supply part, the inert gas is supplied from the upper inert gas supply part into the processing vessel through the gas supply hole.

(h) The device further includes: a control part configured to output a control signal so that the first cleaning gas supply part supplies the cleaning gas in a state in which the mounting stand is moved down to a position lower than the processing position. The control part is configured to output a control signal so that the first cleaning gas supply part supplies the cleaning gas in a state in which the mounting stand is moved up to the processing position.

The purge gas supply part is configured to supply an inert gas, and the control part is configured to output a control signal so that, during the supply of the cleaning gas from the first cleaning gas supply part, the inert gas is supplied from the purge gas supply part into the processing vessel.

(i) The second cleaning gas supply part is configured to use, as a diffusion gas, the purge gas supplied from the purge gas supply part and is configured to supply the cleaning gas to a position where the cleaning gas is diffused to the lower surface side of the mounting stand while riding on a flow of the diffusion gas.

(j) The first cleaning gas supply part is configured to supply the cleaning gas into the processing vessel through the gas supply hole formed in the top plate portion.

(k) The mounting stand includes an annular cover member locked to an upper-surface-side peripheral edge portion of the mounting stand and configured to surround a lateral circumferential surface of the mounting stand at a lateral side of the mounting stand with a gap left between the cover member and the mounting stand, and a groove portion configured to allow the cleaning gas to enter the groove portion is formed in a portion of the cover member where the cover member makes contact with the upper-surface-side peripheral edge portion of the mounting stand.

(l) The device further includes: a control part configured to output a control signal so that the supply of the cleaning gas is performed within the processing vessel evacuated by the vacuum exhaust part and so that the supply of the cleaning gas from the second cleaning gas supply part is performed under a pressure higher than a pressure available during the supply of the cleaning gas from the first cleaning gas supply part.

(m) The vacuum exhaust part is configured to perform a gas evacuation from the processing space to a lateral side through a gap between the mounting stand and the top plate portion.

According to the present disclosure, the gap between the through-hole of the processing vessel and the elevating shaft of the mounting stand is closed using the lid member. Thus, it is possible to give a margin to the gap between the through-hole and the elevating shaft. This makes it possible to provide a film formation device which facilitates assembly and maintenance thereof. When the film formation device is used, the opening between the through-hole and the elevating shaft is closed while permitting formation of a gap between the lid member and the elevating shaft, and a flow of a purge gas flowing from the lower bellows toward the processing vessel is formed. This makes it difficult for a reaction gas to enter the internal space of the bellows. It is therefore possible to restrain a reaction product from being deposited on the inner surface of the bellows and to suppress generation of particles.

DETAILED DESCRIPTION

A configuration of a film formation device according to an embodiment of the present disclosure will be described with reference to FIG. 1. The present film formation device is configured as a device which forms a titanium nitride (TiN) film through an ALD method by alternately supplying a titanium tetrachloride ($TiCl_4$) gas (a raw material gas) and an ammonia ($NH_3$) gas (a nitriding gas), which are mutually-reacting reaction gases, to a surface of a circular wafer W (substrate) which is a film formation target and which has a diameter of, e.g., 300 mm.

Figure 1:
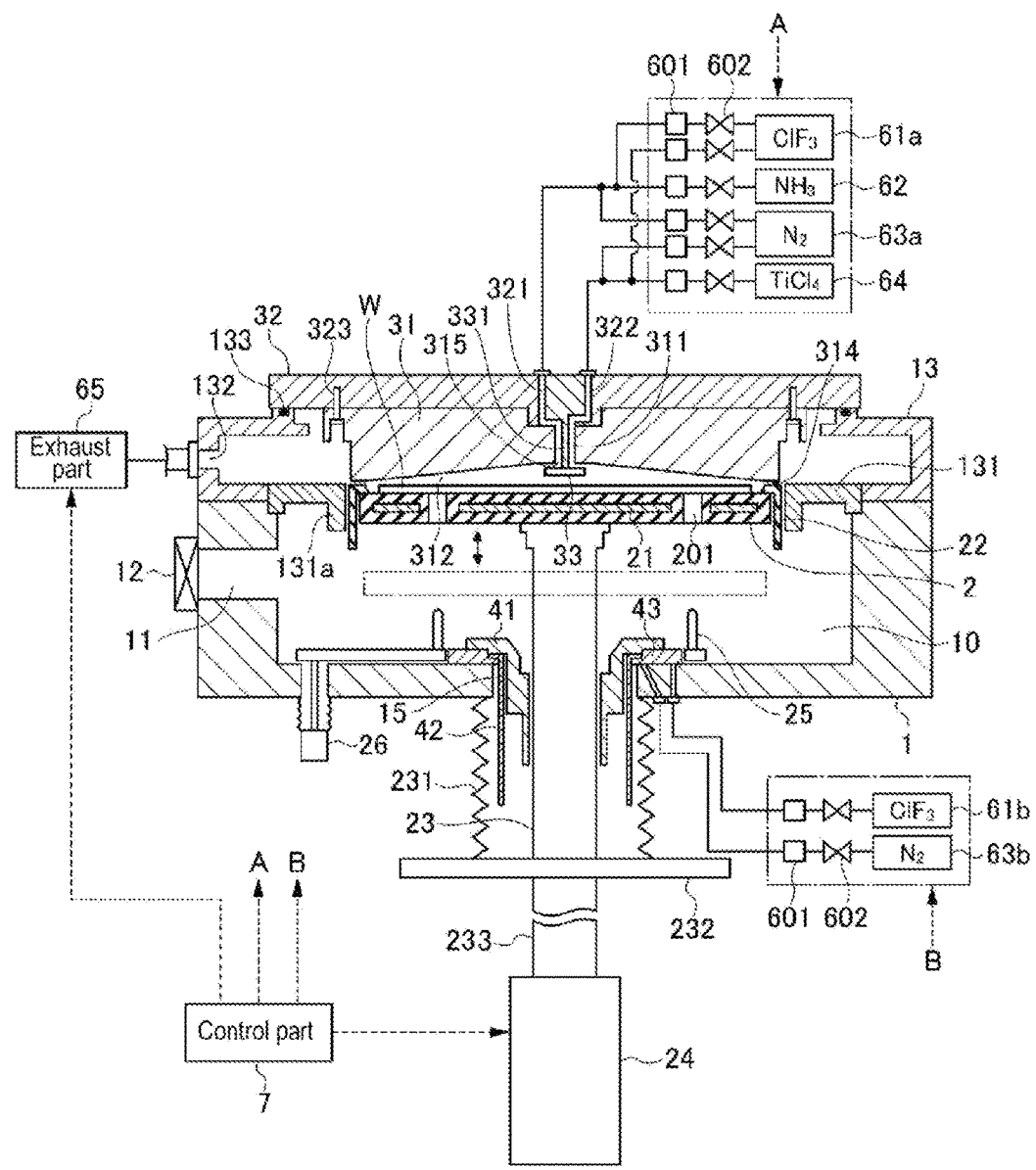
FIG. 1 is a vertical sectional side view of a film formation device according to an embodiment of the present disclosure.

As illustrated in FIG. 1, the film formation device includes a processing vessel 1 which is a vacuum vessel made of metal such as aluminum or the like and having a substantially circular plane-view shape and in which a film formation process to a wafer W is performed, a mounting stand 2 installed within the processing vessel 1 and configured to hold the wafer W, and a top plate portion 31 installed so as to face the mounting stand 2 and configured to define a processing space 312 between the mounting stand 2 and the top plate portion 31. On the side surface of the processing vessel 1, there are provided a loading/unloading gate 11 through which a wafer transfer mechanism installed in an external vacuum transfer chamber is moved into the processing vessel 1 when delivering the wafer W to and from the mounting stand 2, and a gate valve 12 which opens or closes the loading/unloading gate 11.

An exhaust duct 13 made of metal such as aluminum or the like and formed by annularly bending a duct having a rectangular vertical cross-sectional shape is installed so as to overlap with a sidewall which constitutes a body of the processing vessel 1. An inner circumferential surface of the exhaust duct 13 is opened toward the interior of the processing vessel 1 along a circumferential direction. Thus, a gas flowing out from the processing space 312 is exhausted into the exhaust duct 13 through the opening. An exhaust port 132 is formed on an outer wall surface of the exhaust duct 13. An exhaust part 65 formed of a vacuum pump or the like is connected to the exhaust port 132. The exhaust part 65 is connected a pressure gauge (not illustrated) installed in the processing vessel 1. The exhaust part 65 may regulate the internal pressure of the processing vessel 1 by increasing or reducing an exhaust amount based on an indication result of the pressure gauge. The exhaust port 132 and the exhaust part 65 correspond to a vacuum exhaust part which evacuates the interior of the processing space 312.

Within the processing vessel 1, the mounting stand 2 is disposed in a position existing at the inner side of the exhaust duct 13. The mounting stand 2 is formed of a disc slightly larger than the wafer W and is made of ceramics or metal. A heater 21, which is a heating part for heating the wafer W to a film formation temperature of, e.g., 350 degrees C. to 450 degrees C., is embedded within the mounting stand 2. If necessary, there may be installed an electrostatic chuck (not illustrated) for fixing the wafer W within a mounting region defined on the upper surface of the mounting stand 2.

The mounting stand 2 includes a ring-shaped mounting stand cover member 22 which surrounds a lateral circumferential surface of the mounting stand 2 at the lateral side thereof with a gap left between the lateral circumferential surface of the mounting stand 2 and the mounting stand cover member 22. The mounting stand cover member 22 is made of, e.g., alumina, and includes a flat cylindrical tube portion 221 opened at the upper and lower ends thereof. The upper end portion of the tube portion 221 is bent inward over the circumferential direction to form a bent portion 222 (see FIG. 2). The bent portion 222 is locked to the upper-surface-side peripheral edge portion of the mounting stand 2. The thickness of the bent portion 222 is larger than the thickness of the wafer W.

In the mounting stand cover member 22, in order to enhance the cleaning effect of the mounting stand 2 using a below-described cleaning gas, a groove portion 223 for introducing and diffusing the cleaning gas along the circumferential direction is formed at the lower surface side of the bent portion 222 which makes contact with the peripheral edge portion of the mounting stand 2.

As illustrated in FIG. 1, in a position aligned with the lower end of the opening portion of the exhaust duct 13, there is installed an inner ring 131, i.e., a surrounding member, which surrounds the mounting stand 2 so as to fill a gap between the exhaust duct 13 and the mounting stand 2 and which divides the interior of the processing vessel 1 into an upper space (the processing space 312) and a lower space (a bottom area 10). The inner ring 131 is a ring-shaped member made of, e.g., aluminum. The inner ring 131 includes a tube portion 131a disposed so as to surround the lateral circumferential surface of the mounting stand cover member 22 with a gap left therebetween. The upper surface side of the inner ring 131 may be covered with a ring cover made of, e.g., quartz.

A rod-shaped elevating shaft 23 extending in an up-down direction through the bottom surface of the processing vessel 1 is connected to the lower-surface-side central portion of the mounting stand 2. The lower end portion of the elevating shaft 23 is connected to a motor part 24 via a flat elevating plate 232, which is horizontally disposed below the processing vessel 1, and a cylinder rod 233. The motor part 24 is configured to extend or retract the cylinder rod 233. The elevating plate 232, the cylinder rod 233 and the motor part 24 constitute an elevator mechanism for the elevating shaft 23. The elevator mechanism moves the elevating shaft 23 up and down, thereby moving the mounting stand 2 up and down between a processing position in which film formation is performed to the wafer W and a delivery position (indicted by a single-dot chain line in FIG. 1) which exists below the processing position and in which the wafer W is delivered to and from the wafer transfer mechanism moved into the processing vessel 1 through the loading/unloading gate 11.

Figure 4:
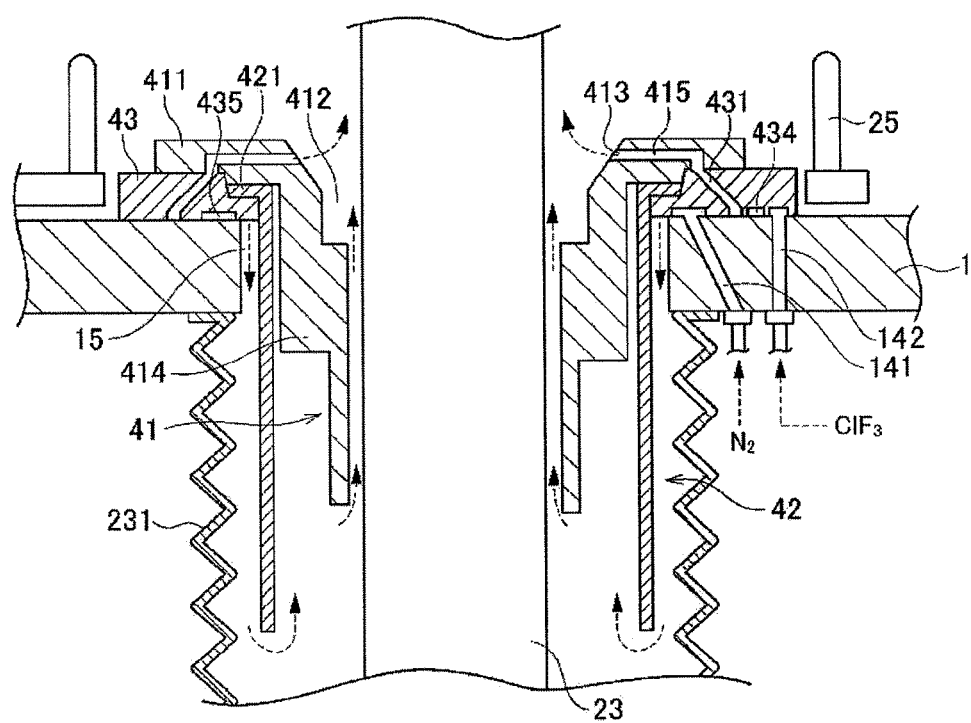
FIG. 4 is a vertical sectional view of a connection portion of a bellows and the processing vessel.

As illustrated in FIGS. 1 and 4, a through-hole 15 through which the elevating shaft 23 passes is formed on the bottom surface of the processing vessel 1. The elevating shaft 23 extends through the inside of the through-hole 15. The elevating shaft 23 is connected to the elevating plate 232 in a position existing below the processing vessel 1. The opening diameter of the through-hole 15 is set such that, for example, the lateral circumferential surface of the elevating shaft 23 can be disposed in a position spaced apart inward by about 10 to 50 mm from the inner circumferential surface of the through-hole 15. In order to maintain the interior of the processing vessel 1 having the through-hole 15 in a vacuum atmosphere, a bellows 231 which isolates the internal atmosphere of the processing vessel 1 from the outside and which expands and contracts pursuant to the up/down operation of the elevating plate 232 is installed between the edge portion of the through-hole 15 and the elevating plate 232 so as to cover the periphery of the elevating shaft 23 at the lateral side thereof.

At the lower side of the mounting stand 2, there are installed, for example, three support pins 25 which support the lower surface of the wafer W and lift up the wafer W when delivering the wafer W to and from an external wafer transfer mechanism. The support pins 25 are connected to an elevator mechanism 26 and can be moved up and down. The delivery of the wafer W to and from the wafer transfer mechanism is performed by allowing the support pins 25 to protrude or retract from the upper surface of the mounting stand 2 through through-holes 201 which penetrate the mounting stand 2 in the up-down direction.

A disc-shaped support plate 32 is installed at the upper surface side of the exhaust duct 13 so as to close the circular opening of the exhaust duct 13. An O-ring 133 for keeping the interior of the processing vessel 1 airtight is installed between the exhaust duct 13 and the support plate 32. The top plate portion 31 which includes an opening portion 315 for supplying a reaction gas or a substitution gas into the processing space 312 is installed at the lower surface side of the support plate 32. The top plate portion 31 is fixed to the support plate 32 by bolts 323.

A concave portion is formed at the lower surface side of the top plate portion 31. A slant surface extending from the center in some embodiments toward the periphery side is formed in the concave portion. A flat tip portion 314 is annularly installed at the outer side of the slant surface. The top plate portion 31 is disposed so that, when the mounting stand 2 is moved up to the processing position, the upper surface of the mounting stand cover member 22 installed in the mounting stand 2 faces the lower surface of the tip portion 314. The space surrounded by the concave portion of the top plate portion 31 and the upper surface of the mounting stand 2 becomes the processing space 312 in which film formation is performed to the wafer W.

As illustrated in FIG. 1, the height of the processing position of the mounting stand 2 is set such that a gap is formed between the lower surface of the tip portion 314 of the top plate portion 31 and the upper surface of the bent portion 222 of the mounting stand cover member 22. The exhaust duct 13 is opened toward the gap. Thus, the reaction gas supplied into the processing space 312 is exhausted toward the lateral side.

A gas supply path 311 through which a reaction gas is supplied into the processing space 312 is formed in the central portion of the concave portion of the top plate portion 31. The gas supply path 311 penetrates the central portion of the top plate portion 31 in the up-down direction. The opening portion 315 (a gas supply hole) opened downward toward the mounting stand 2 is formed at the lower end portion of the gas supply path 311. A dispersion plate 33 for allowing the reaction gas supplied from the gas supply path 311 to impinge against the diffusion plate 33 and diffusing the reaction gas into the processing space 312 is installed below the opening portion 315.

The diffusion plate 33 is formed of, e.g., a circular plate member. The upper-surface-side central portion of the diffusion plate 33 is supported by a support rod 331 extending from the lower surface of the support plate 32. The diffusion plate 33 is disposed below the opening portion 315 so that, when the opening portion 315 of the gas supply path 311 is seen from directly below, the diffusion plate 33 covers the opening portion 315.

The upstream side of the gas supply path 311 is branched into an ammonia supply path 321 through which an ammonia gas and a substitution-purpose nitrogen gas are supplied to the gas supply path 311 and a titanium tetrachloride supply path 322 through which a titanium tetrachloride gas and a substitution-purpose nitrogen gas are supplied to the gas supply path 311.

The ammonia supply path 321 and the titanium tetrachloride supply path 322 are connected to an ammonia gas supply source 62 and a titanium tetrachloride gas supply source 64, respectively, through pipelines. The pipelines are branched in the intermediate portions thereof and are connected to a common nitrogen gas supply source 63a. An opening/closing valve 602 which performs supply and cutoff of a gas and a flow rate adjustment part 601 which performs adjustment of a gas flow rate are installed in each of the pipelines.

The film formation device includes a mechanism for supplying a cleaning gas from different positions to the upper surface side and the lower surface side of the mounting stand 2 in order to remove a reaction product adhering to the components disposed within the processing vessel 1. In the film formation device of the present embodiment, a cleaning gas is supplied to the upper surface side of the mounting stand 2 through the gas supply path 311 described above.

More specifically, the pipelines of the ammonia supply path 321 and the titanium tetrachloride supply path 322, through which the ammonia gas and the titanium tetrachloride gas are supplied during film formation, are respectively branched and are connected to a common cleaning gas supply source 61a. In the present embodiment, there is illustrated an example where chlorine trifluoride ($ClF_3$) is used as the cleaning gas. An opening/closing valve 602 which performs supply and cutoff of a gas and a flow rate adjustment part 601 which performs adjustment of a gas flow rate are installed in each of the pipelines. From the viewpoint of supplying the cleaning gas from the upper surface side of the mounting stand 2 into the processing vessel 1, the gas supply path 311, the ammonia supply path 321, the titanium tetrachloride supply path 322 and the cleaning gas supply source 61a correspond to a first cleaning gas supply part of the present embodiment.

In the film formation device having the aforementioned configuration, there is installed a mechanism for suppressing deposition of a reaction product which may occur when the reaction gas supplied into the processing vessel 1 reaches the inner surface of the bellows 231 through between the through-hole 15 and the elevating shaft 23. Hereinafter, descriptions will be made on the configuration of this mechanism.

Figure 3:
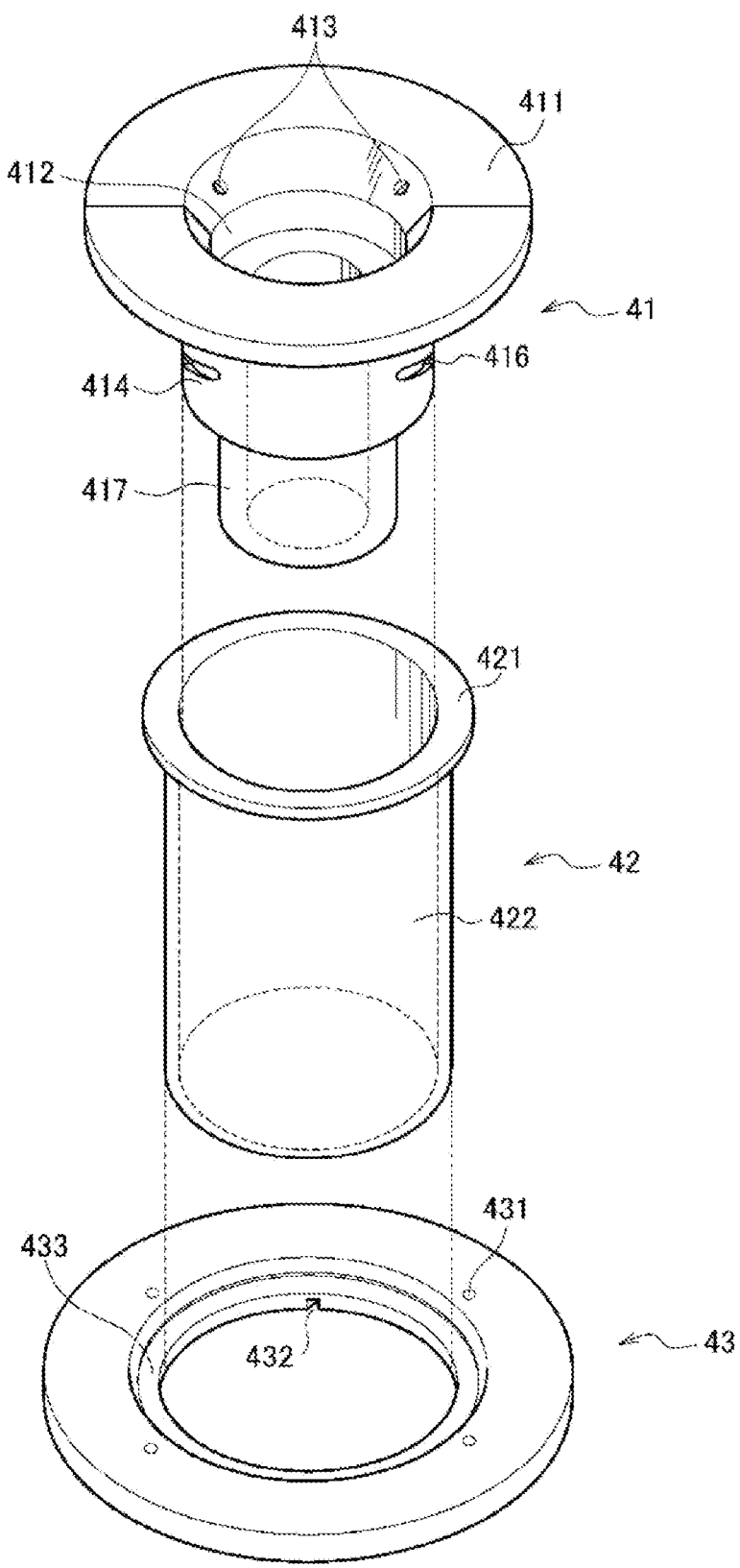
FIG. 3 is a perspective view of a lid member, etc. installed in a bottom portion of a processing vessel that constitutes the film formation device.

In order to restrain the reaction gas from reaching the bellows 231, in the through-hole 15, there are installed a lid member 41 inserted between the body of the processing vessel 1 and the elevating shaft 23 and configured to close the through-hole 15, a tubular member 42 disposed between the lid member 41 and the bellows 231, and a ring member 43 disposed on the bottom surface of the processing vessel 1 and configured to support the lid member 41 and the tubular member 42 (see FIGS. 3 and 4).

The lid member 41 is a tubular member which closes the space existing between the through-hole 15 formed on the bottom surface of the processing vessel 1 and the elevating shaft 23. The lid member 41 includes a cylindrical portion 414 which forms a body of the lid member 41 and a flange portion 411 which is formed at the upper end of the cylindrical portion 414. The lid member 41 is disposed between the through-hole 15 and the elevating shaft 23 with the lower surface of the flange portion 411 locked to the ring member 43.

As illustrated in FIG. 4, the lid member 41 is disposed so that a gap is formed between the lateral circumferential surface of the elevating shaft 23 and the inner circumferential surface of the cylindrical portion 414. The elevating shaft 23 is freely movable through the lid member 41 in the up-down direction. Differently describing the arrangement state of the elevating shaft 23 and the lid member 41, it can be said that the lid member 41 is disposed so as to surround the elevating shaft 23 with a gap left between the lid member 41 and the lateral circumferential surface of the elevating shaft 23. Furthermore, it can be said that the lid member 41 is attached to the processing vessel 1 over the entire circumference thereof so that the communication between the space below the lid member 41 (the space existing within the bellows 231) and the space above the lid member 41 (the space existing within the processing vessel 1) is prevented in the regions other than the gap.

Furthermore, the lid member 41 includes a recess portion 412 which is formed by enlarging the diameter of the inner circumferential surface of the cylindrical portion 414 existing close to the flange portion 411 in order to suppress a temperature rise attributable to the heat dissipation from the mounting stand 2 provided with the heater 21 (the heat radiation, the heat transfer via a below-described nitrogen gas, etc.). By forming the recess portion 412, the distance between the mounting stand 2 and the surface of the lid member 41 grows larger. This makes it possible to suppress a temperature rise in the flange portion 411 attributable to the heat dissipation from the mounting stand 2. In addition, a sleeve 417 having a thickness smaller than the thickness of the body of the cylindrical portion 414 is formed in the lower portion of the cylindrical portion 414 so that the height of a region where the lateral circumferential surface of the elevating shaft 23 and the inner circumferential surface of the cylindrical portion 414 face each other across the gap becomes as large as possible and so that the heat storage amount of the lid member 41 does not grow too large.

The dimension of the gap between the elevating shaft 23 and the lid member 41 (the cylindrical portion 414) is, e.g., 1 to 5 mm. The height dimension of the lid member 41 which faces the elevating shaft 23 across the gap (the distance from the bottom surface of the recess portion 412 to the lower end of the sleeve 417) is preferably set larger than the height dimension of the inner circumferential surface of the through-hole 15 (the thickness dimension of the processing vessel 1). Thus, the reaction gas exiting within the processing vessel 1 is difficult to enter the interior of the bellows 231.

As illustrated in FIG. 3, the tubular member 42 has a structure in which a flange portion 421 is installed at the upper end of a cylindrical body portion 422. The tubular member 42 is disposed between the lid member 41 and the bellows 231 with the flange portion 421 locked to the ring member 43. As illustrated in FIG. 4, the height dimension of the tubular member 42 is set such that, when the lid member 41 and the tubular member 42 are disposed in predetermined positions, the lower end portion of the tubular member 42 is positioned lower than the lower end portion of the lid member 41 (the sleeve 417). Thus, the distance from the outlet of the gap between the elevating shaft 23 and the lid member 41 to the inner wall surface of the bellows 231 is made longer and the reaction gas which enters the interior of the bellows 231 is restrained from reaching the inner wall surface of the bellows 231.

The ring member 43 is disposed and fixed around the through-hole 15 on the bottom surface of the processing vessel 1. The ring member 43 locks the flange portions 411 and 421 of the lid member 41 and the tubular member 42, thereby supporting the lid member 41 and the tubular member 42. A stepped portion 433 for fitting and fixing the flange portion 421 of the tubular member 42 between the upper surface of the ring member 43 and the lower surface of the flange portion 411 of the lid member 41 is formed in the upper-surface-side inner peripheral edge portion of the ring member 43.

Figure 5:
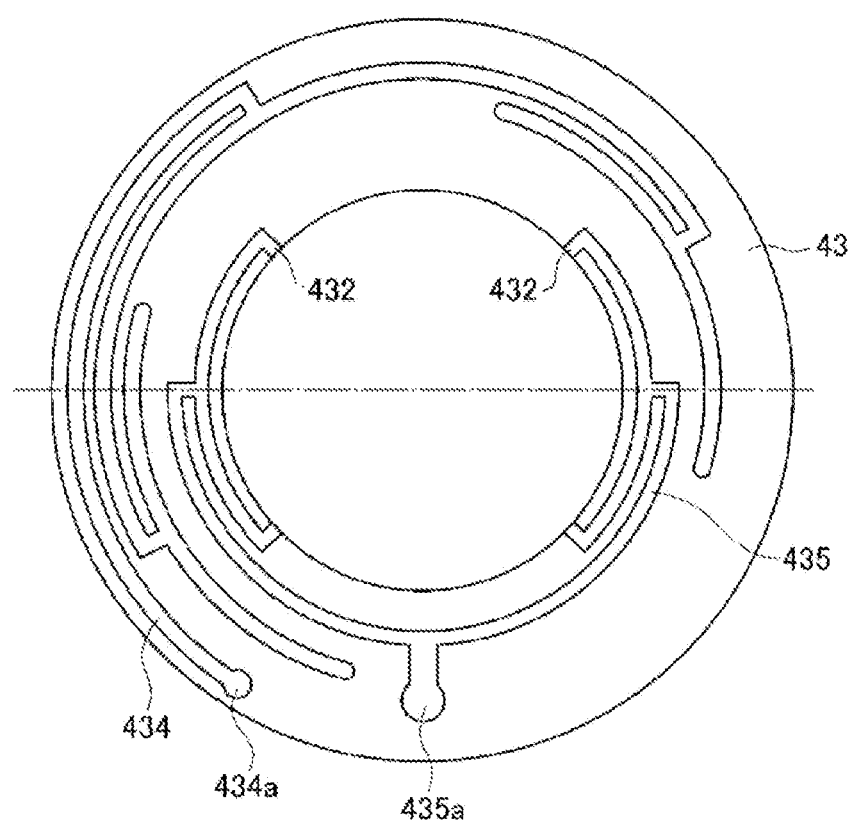
FIG. 5 is a bottom view of a ring member which supplies a purge gas into the bellows.

As illustrated in FIG. 5, a groove portion for supplying an inert gas as a purge gas, e.g., a nitrogen gas, into the bellows 231 is formed on the lower surface of the ring member 43. By fixing the ring member 43 having the groove portion to the bottom surface of the processing vessel 1, the space surrounded by the groove portion and the processing vessel 1 becomes a nitrogen gas flow path 435. In the following descriptions, for the sake of convenience, the groove portion itself will also be referred to as the nitrogen gas flow path 435.

A port portion 435a formed at the base end side of the nitrogen gas flow path 435 is connected to a nitrogen gas supply path 141 formed in the processing vessel 1. The nitrogen gas supply path 141 is connected to a nitrogen gas supply source 63b via a pipeline. Similar to the nitrogen gas supply source 63a disposed at the side of the top plate portion 31, an opening/closing valve 602 which performs supply and cutoff of a gas and a flow rate adjustment part 601 which performs adjustment of a gas flow rate are installed in the pipeline. For the sake of convenience in illustration and description, there is illustrated a case where the nitrogen gas supply sources 63a and 63b are independently installed in the film formation device of the present embodiment. However, it goes without saying that if necessary, the nitrogen gas supply sources 63a and 63b may be used in common.

Four nitrogen gas ejection holes 432 opened toward the inner circumferential surface of the ring member 43 are formed at the ends of the nitrogen gas flow path 435. The nitrogen gas ejection holes 432 are disposed substantially at regular intervals along the circumferential direction of the inner circumferential surface of the ring member 43. In this regard, the nitrogen gas flow path 435 is branched so that the flow path lengths from the port portion 435a to the respective nitrogen gas ejection holes 432 become substantially equal to each other and the flow path conductance become uniform. The nitrogen gas supply source 63b, the nitrogen gas supply path 141, the nitrogen gas flow path 435 and the nitrogen gas ejection holes 432 correspond to a purge gas supply part of the present embodiment.

As illustrated in FIG. 4 and other figures, the nitrogen gas ejected from the nitrogen gas ejection holes 432 is supplied to the upper position of the gap between the through-hole 15 of the processing vessel 1 and the tubular member 42. The nitrogen gas flows from the upper side toward the lower side through the gap. By forming the flow of the nitrogen gas flowing along the bellows 231 in this way, it is possible to restrain the reaction gas from adhering to the inner wall surface of the bellows 231.

As described above, the lid member 41 and the ring member 43 are installed to restrain the reaction gas from entering the interior of the bellows 231. In the film formation device of the present embodiment, the supply of a cleaning gas to the lower surface side of the mounting stand 2 is performed using the lid member 41 and the ring member 43. With regard to the supply of the cleaning gas, a groove portion for supplying the cleaning gas into the processing vessel 1 so as to flow toward the lower surface side of the mounting stand 2 is formed on the lower surface of the ring member 43. The space surrounded by the groove portion and the processing vessel 1 becomes a cleaning gas flow path 434 (In the following descriptions, the groove portion will also be referred to as the cleaning gas flow path 434).

A port portion 434a formed at the base end side of the cleaning gas flow path 434 is connected to a cleaning gas supply path 142 formed in the processing vessel 1. The cleaning gas supply path 142 is connected to a cleaning gas supply source 61b which performs the supply of chlorine trifluoride as a cleaning gas via a pipeline in which an opening/closing valve 602 and a flow rate adjustment part 601 are installed. For the sake of convenience in illustration and description, there is illustrated a case where the cleaning gas supply sources 61a and 61b are independently installed in the film formation device of the present embodiment. However, if necessary, the cleaning gas supply sources 61a and 61b may be used in common.

Similar to the nitrogen gas flow path 435, the cleaning gas flow path 434 is branched into four flow paths so that the flow path lengths become substantially equal to each other and the flow path conductance become uniform. The end portions of the cleaning gas flow path 434 are connected to connection flow paths 431 which interconnect a cleaning gas introduction paths 415 formed in the flange portion 411 of the lid member 41 and the cleaning gas flow path 434. The end portions of the connection flow paths 431 are opened on the upper surface of the ring member 43 and are connected to the cleaning gas introduction paths 415 opened on the lower surface of the flange portion 411 of the lid member 41.

The cleaning gas introduction paths 415 extend radially inward through the flange portion 411 in the horizontal direction. The cleaning gas introduction paths 415 are opened toward a slant surface positioned in the upper end portion of the recess portion 412. These opening portions correspond to cleaning gas ejection holes 413 from which the cleaning gas is ejected into the processing vessel 1. The cleaning gas ejection holes 413 are disposed substantially at regular intervals along the circumferential direction of the slant surface of the recess portion 412.

From the viewpoint of supplying the cleaning gas from the lower surface side of the mounting stand 2 into the processing vessel 1, the cleaning gas introduction paths 415, the connection flow paths 431, the cleaning gas flow path 434, the cleaning gas supply path 142 and the cleaning gas supply source 61b correspond to a second cleaning gas supply part of the present embodiment. For the sake of convenience in illustration, in the vertical sectional views other than FIG. 4, the cleaning gas introduction paths 415, the connection flow paths 431, the cleaning gas flow path 434, the nitrogen gas flow path 435, the cleaning gas supply path 142 and the nitrogen gas supply path 141 are appropriately omitted.

As illustrated in FIG. 3, the lid member 41 is formed of members bisected along the direction of a center axis. For example, when assembling the film formation device, the elevating shaft 23 which supports the mounting stand 2 is inserted into the through-hole 15 in which the tubular member 42 and the ring member 43 are disposed in advance, thereby connecting the elevating shaft 23 to the elevator mechanism. Thereafter, the members which constitute the lid member 41 are disposed so as to sandwich the elevating shaft 23 at the lateral sides thereof. After the members are fastened together by screws 416, the lid member 41 is disposed in a predetermined position. By giving a margin to the gap between the through-hole 15 and the elevating shaft 23, it becomes easy to perform the assembly of the film formation device and the subsequent maintenance.

The film formation device having the configuration described above is connected to a control part 7 as illustrated in FIG. 1. The control part 7 is formed of, e.g., a computer which includes a CPU (not illustrated) and a memory part (not illustrated). The memory part stores a program which incorporates a step (command) group regarding the control of the actions of the film formation device, namely the operations of moving the wafer W mounted on the mounting stand 2 up to the processing position, performing the formation of a TiN film by supplying the reaction gas and the substitution-purpose gas into the processing space 312 in a predetermined order, and performing the cleaning of the interior of the processing vessel 1 using the cleaning gas. The program is stored in a storage medium such as, e.g., a hard disk, a compact disk, a magneto-optical disk or a memory card, and is installed from the storage medium onto the computer.

Figure 6:
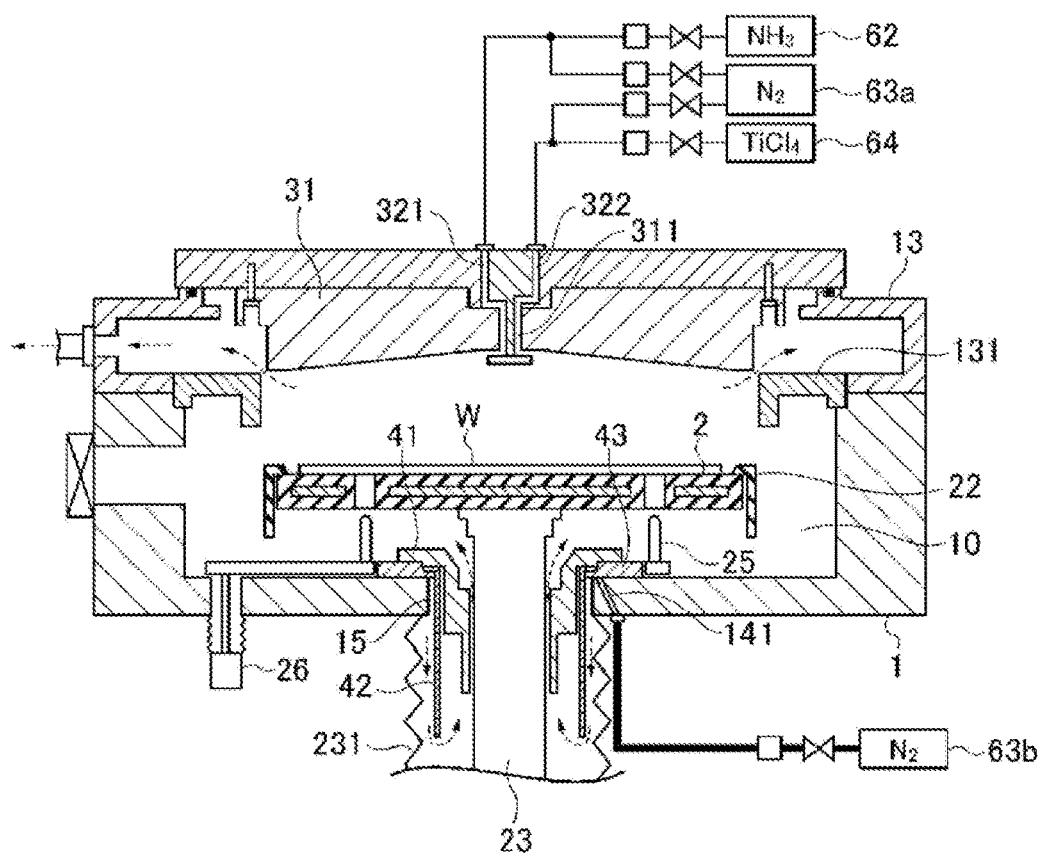
FIG. 6 is an explanatory view of a first action of the film formation device.
Figure 7:
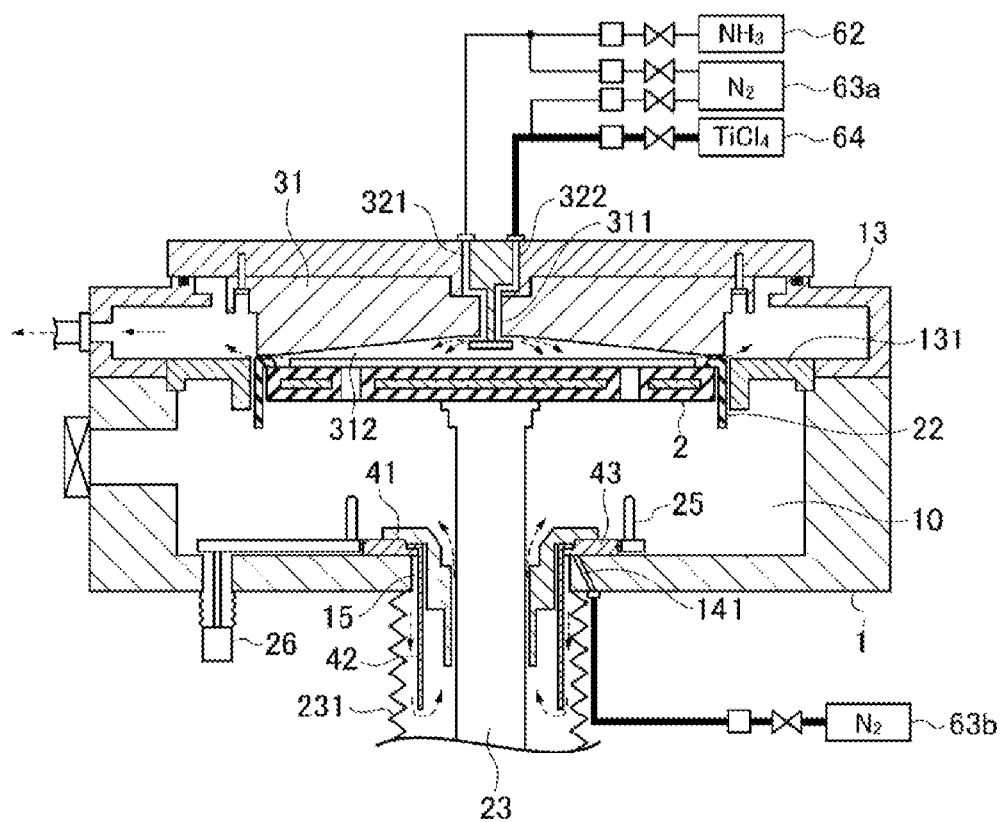
FIG. 7 is an explanatory view of a second action of the film formation device.

Next, the actions of performing the formation of a TiN film using the present film formation device will be described with reference to FIGS. 4, 6 and 7. In FIGS. 6 and 7, the cleaning gas supply sources 61a and 61b and the flow paths connected to the cleaning gas supply sources 61a and 61b are omitted. First, the interior of the processing vessel 1 is depressurized in advance to a vacuum atmosphere and then the mounting stand 2 is moved down to the delivery position as illustrated in FIG. 6. Then, the gate valve 12 is opened. The transfer arm of the wafer transfer mechanism installed in the vacuum transfer chamber connected to the loading/unloading gate 11 is caused to enter the processing vessel 1. The delivery of the wafer W between the transfer arm and the support pins 25 is performed. Thereafter, the support pins 25 are moved down to mount the wafer W onto the mounting stand 2 heated to the aforementioned film formation temperature by the heater 21.

At this time, as illustrated in FIGS. 4 and 6, the nitrogen gas is supplied from the nitrogen gas supply source 63b into the bellows 231 at a flow rate of 1,500 sccm which falls within a range of 100 to 5,000 sccm (at 0 degree C. and 1 atm). The nitrogen gas introduced from the nitrogen gas ejection holes 432 into the bellows 231 flows from the upper side toward the lower side through the gap formed between the outer circumferential surface of the tubular member 42 and the inner circumferential surface of the bellows 231. The nitrogen gas ultimately reaches the lower end portion of the tubular member 42 and spreads into the entirety of the internal space of the bellows 231. A part of the nitrogen gas flows into the gap between the elevating shaft 23 and the lid member 41. Then, the nitrogen gas flows into the bottom area 10 of the processing vessel 1 through the gap. The nitrogen gas is moved upward within the interior of the processing vessel 1 and is exhausted from the exhaust port 132.

If the wafer W is mounted on the mounting stand 2, the gate valve 12 is closed. The mounting stand 2 is moved up to the processing position to form the processing space 312. The internal pressure of the processing vessel 1 is regulated. Subsequently, the supply of the reaction gases (the titanium tetrachloride gas and the ammonia gas) and the substitution-purpose gas (the nitrogen gas) to the surface of the wafer W heated to a predetermined temperature through the gas supply path 311 is repeated in the order of the titanium tetrachloride gas, the nitrogen gas, the ammonia gas and the nitrogen gas (see FIG. 7). As a result, the reaction gases adsorbed to the wafer W react with each other to form a molecular layer of titanium nitride (TiN). The molecular layers thus formed are laminated one above another to form a titanium nitride film. In FIG. 7, there is illustrated a state in which the titanium tetrachloride gas is supplied to the processing space 312.

Even if the temperature of the mounting stand 2 is increased by the heater 21 during the film formation on the wafer W, the temperature rise in the lid member 41 attributable to the heat dissipation from the mounting stand 2 is suppressed because the distance between the mounting stand 2 and the lid member 41 is increased by forming the recess portion 412 on the upper surface of the lid member 41. As a result, it is possible to suppress generation of corrosion attributable to the temperature rise in the members which constitute the lid member 41.

During the film formation on the wafer W, the nitrogen gas is continuously supplied from the nitrogen gas supply source 63b into the bellows 231. The nitrogen gas is supplied to the bottom area 10 through the gap between the elevating shaft 23 and the lid member 41. Since the inner ring 131 is disposed around the mounting stand 2 moved up to the processing position, the interior of the processing vessel 1 is divided into an upper space (the processing space 312 and the internal space of the exhaust duct 13) existing above the mounting stand 2 and the inner ring 131 and a lower space (the bottom area 10) existing below the mounting stand 2 and the inner ring 131.

The nitrogen gas flowing into the bottom area 10 is introduced into the exhaust duct 13 through the gap between the mounting stand 2 and the inner ring 131 and is discharged to the outside. By allowing the nitrogen gas to flow between the mounting stand 2 and the inner ring 131 which define the upper and lower spaces of the mounting stand 2, it is possible to restrain the reaction gases flowing through the processing space 312 or the interior of the exhaust duct 13 from entering the interior of the bottom area 10.

Accordingly, when seen from the side of the bellows 231, it can be said that the film formation device of the present embodiment doubly suppresses the entry of the reaction gases using the flow of the nitrogen gas which flows through the gap between the mounting stand 2 and the inner ring 131 and the flow of the nitrogen gas which flows through the gap between the elevating shaft 23 and the lid member 41.

Even when a part of the reaction gases enters the lower space against the flow of the nitrogen gas, the reaction gases are difficult to reach the interior of the bellows 231 because the height dimension of the gap between the elevating shaft 23 and the lid member 41 is enlarged in the up-down direction. Even if a part of the reaction gas enters the interior of the bellows 231, it is possible to restrain the reaction gases from reaching the bellows 231 having a movable portion and to suppress generation of particles attributable to adhesion of a reaction product, because the tubular member 42 is disposed inside the bellows 231. Furthermore, the flow of the nitrogen gas flowing through the gap between the tubular member 42 and the bellows 231 provides an effect of restraining the reaction gases from reaching the inner wall surface of the bellows 231.

After a titanium nitride film having a desired film thickness is formed by repeating the supply cycle of the reaction gases and the substitution gas several ten times to several hundred times, the supply of the gases is stopped and the evacuation of the interior of the processing vessel 1 is stopped. The mounting stand 2 is moved down. The gate valve 12 is opened and the wafer W is taken out.

The film formation device according to the present embodiment provides the following effects. During the use of the film formation device, the flow of the nitrogen gas (the purge gas) flowing from the lower bellows 231 toward the processing vessel 1 is formed by closing the opening between the through-hole 15 and the elevating shaft 23 while forming a gap between the lid member 41 and the elevating shaft 23. For that reason, the reaction gases are difficult to enter the internal space of the bellows 231. It is therefore possible to suppress deposition of a reaction product on the inner surface of the bellows 231 and to suppress generation of particles.

Figure 8:
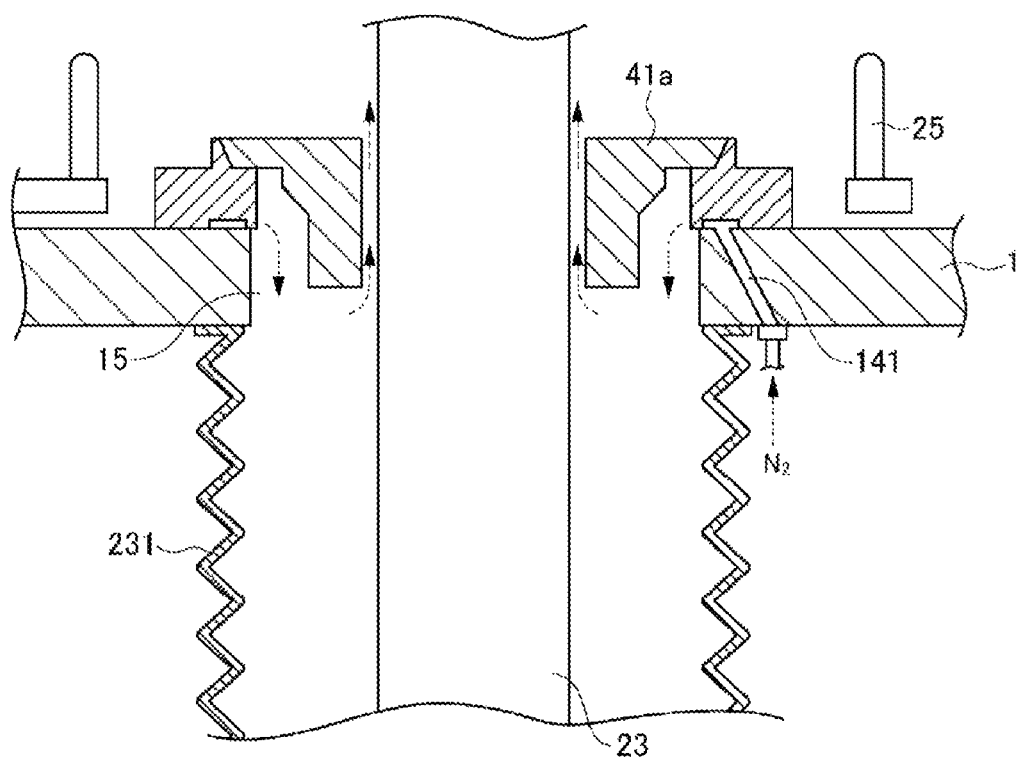
FIG. 8 is an explanatory view illustrating another example of the lid member.

In this regard, it is not essential requirements to form the recess portion 412 or the sleeve 417 in the lid member 41 and to install the tubular member 42 between the lid member 41 and the bellows 231. For example, as illustrated in FIG. 8, a lid member 41a not including the recess portion 412 or the sleeve 417 may be disposed and the arrangement of the tubular member 42 may be omitted.

Figure 9:
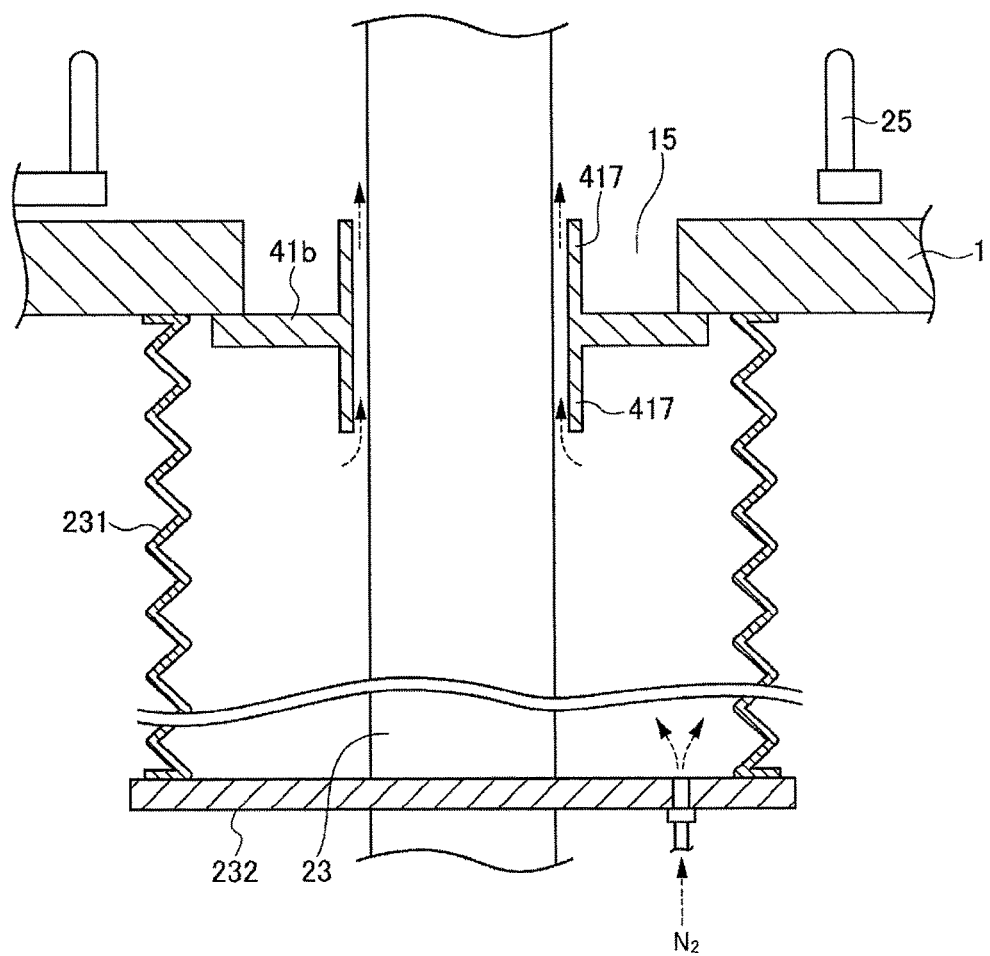
FIG. 9 is an explanatory view illustrating still another example of the lid member.

FIG. 9 illustrates an example where sleeves 417 are installed at the upper surface side and the lower surface side of a disc-shaped lid member 41b which is attached to the lower-surface-side edge portion of the through-hole 15 by screwing or the like. Alternatively, a sleeve 417 may be installed only at the upper surface side of the lid member 41b. Furthermore, the position from which the nitrogen gas is introduced into the bellows 231 may be changed. In FIG. 9, there is illustrated an example where the nitrogen gas is supplied from the elevating plate 232.

Subsequently, the action of cleaning the interior of the processing vessel 1 will be described with reference to FIGS. 1, 2, 4 and 10 to 13. Performing the aforementioned film formation operation repeatedly, there is a possibility that a reaction product originating from the reaction gases is deposited on the inner wall of the processing vessel 1 or the surfaces of the components, which may be a cause of generation of particles. Accordingly, cleaning is performed every predetermined time or every predetermined wafer number.

Figure 10:
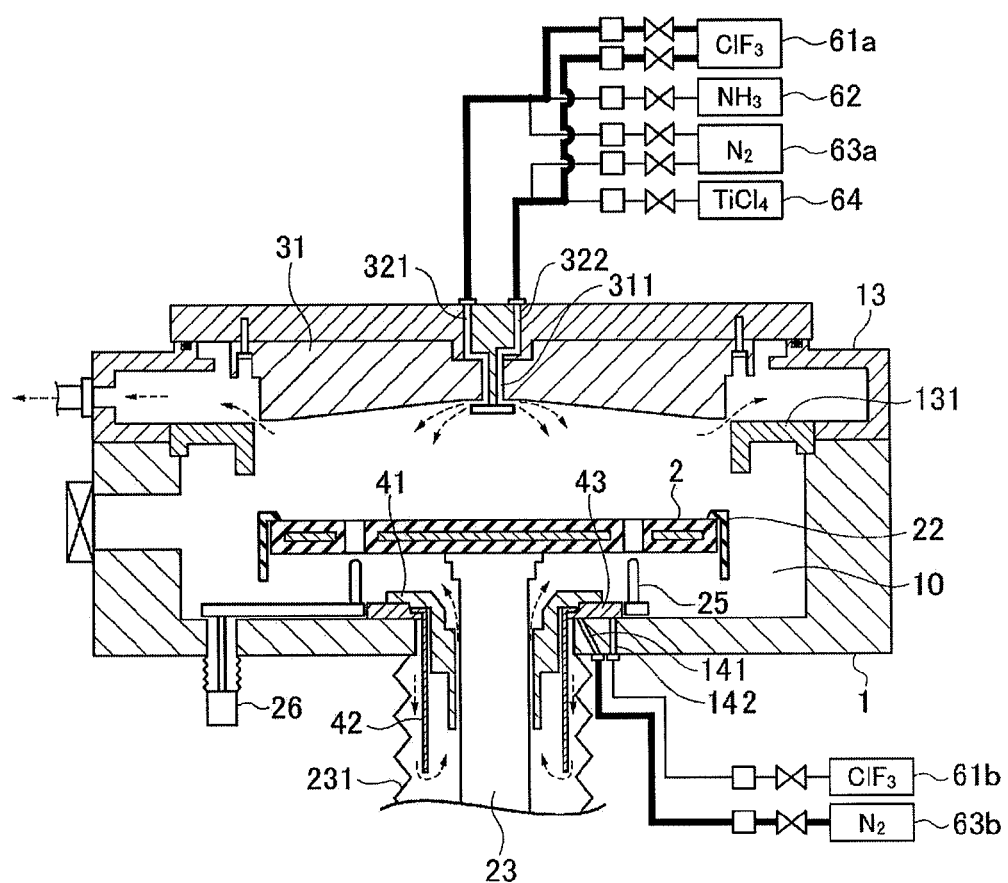
FIG. 10 is an explanatory view of a first action of a cleaning operation of the film formation device.

In the cleaning, the interior of the processing vessel 1 is vacuum-evacuated in a state in which the wafer W is not mounted on the mounting stand 2. Pressure regulation is performed so that the interior of the processing vessel 1 has a pressure of, e.g., 266.6 Pa (2 Torr) which falls within a range of 66.7 to 666.6 Pa (0.5 to 5 Torr). Then, as illustrated in FIG. 10, the mounting stand 2 is positioned below the processing position. Thus, the space existing above the inner ring 131 (the space which becomes the processing space 312 when the mounting stand 2 is moved to the processing position and the internal space of the exhaust duct 13) is brought into communication with the bottom area 10.

Next, while performing the pressure regulation, the temperature of the mounting stand 2 is adjusted by the heater 21 to become a cleaning temperature (e.g., 200 degrees C. which falls within a range of 180 to 300 degrees C.). The cleaning gas is supplied into the processing vessel 1 through the gas supply path 311 at a flow rate of, e.g., 120 sccm which falls within a range of 5 to 1,000 sccm (0 degree C. and 1 atm basis). While not illustrated in FIGS. 10 and 11, the nitrogen gas as a dilution gas is supplied from the nitrogen gas supply source 63*a* at a flow rate of, e.g., 280 sccm which falls within a range of 10 to 2,000 sccm, and is mixed with the cleaning gas.

Figure 11:
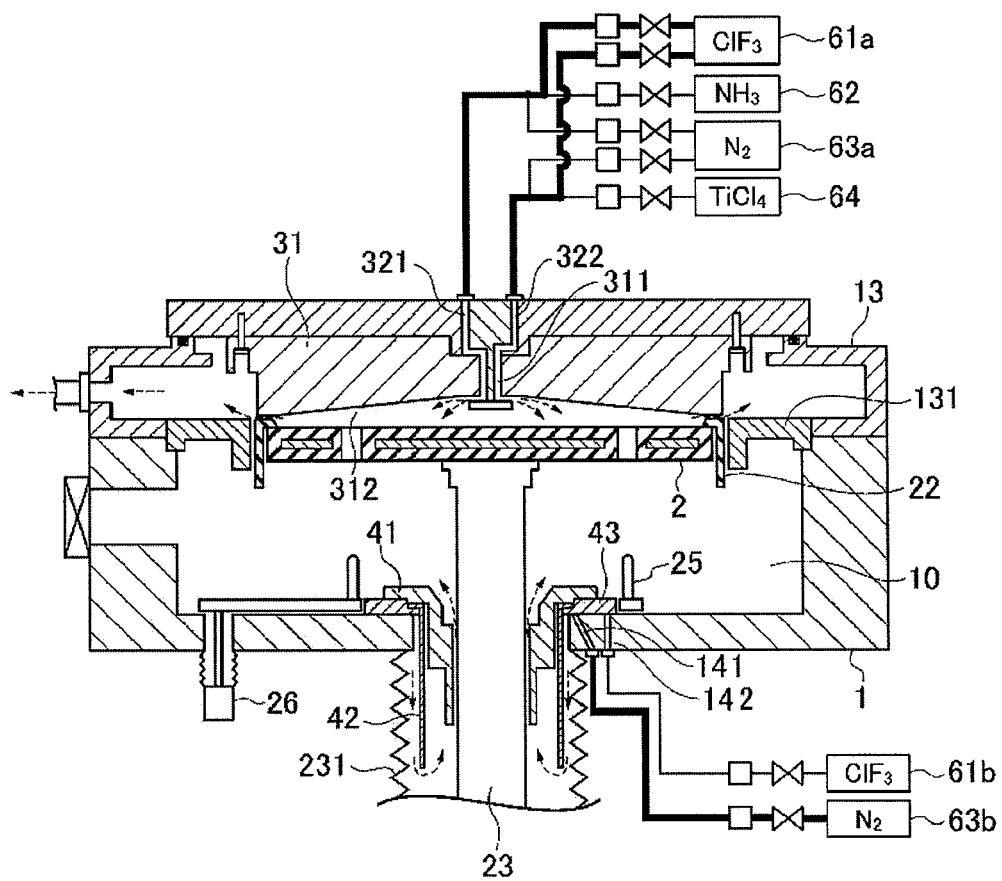
FIG. 11 is an explanatory view of a second action of the cleaning operation of the film formation device.

In FIGS. 10 and 11, there is illustrated an example where the cleaning gas is supplied toward the gas supply path 311 through the ammonia supply path 321 and the titanium tetrachloride supply path 322 in order to perform cleaning of the interior of the ammonia supply path 321 and the interior of the titanium tetrachloride supply path 322. However, the supply of the cleaning gas to the gas supply path 311 is not limited to the case where the two supply paths 321 and 322 are used. If necessary, only one of the supply paths 321 and 322 may be used or the supply paths 321 and 322 may be used by sequentially switching them.

If the cleaning gas is supplied from the upper surface side of the downwardly-moving mounting stand 2 into the processing vessel 1 through the gas supply path 311, the cleaning gas is diffused into the entirety of the interior of the processing vessel 1 through the inside of the inner ring 131. Then, the cleaning gas makes contact with the respective components such as the inner wall of the processing vessel 1, the top plate portion 31, the inner ring 131, the mounting stand 2 and so forth, thereby removing the reaction product.

At this time, at the bottom surface side of the processing vessel 1, the nitrogen gas is supplied from the nitrogen gas supply source 63*b* at a flow rate of, e.g., 1,500 sccm which falls within a range of 100 to 5,000 sccm, thereby restraining the cleaning gas from entering the bellows 231 which is not a cleaning target. Accordingly, it can be said that during the time period in which the cleaning gas is supplied from the upper surface side of the mounting stand 2, the inert gas is supplied to the gap between the elevating shaft 23 and the lid member 41 from the purge gas supply part (the nitrogen gas supply source 63*b*, the nitrogen gas supply path 141, the nitrogen gas flow path 435, the nitrogen gas ejection holes 432, etc.).

After the cleaning is performed for a predetermined time in the state illustrated in FIG. 10, the mounting stand 2 is moved to the processing position without changing the setting of the internal pressure of the processing vessel 1 and the supply amounts of the cleaning gas, the dilution gas and the nitrogen gas supplied from the bottom surface side (see FIG. 11). Thus, the cleaning gas is directly injected toward the mounting stand 2. It is therefore possible to sufficiently clean the upper surface of the mounting stand 2 to which the reaction product easily adheres. Furthermore, if the conductance of the gap between the mounting stand 2 and the inner ring 131 is reduced and the pressure of the bottom area 10 is increased by moving the mounting stand 2 to the processing position, the supply amount of the nitrogen gas supplied from the side of the bellows 231 may be appropriately reduced.

Figure 12:
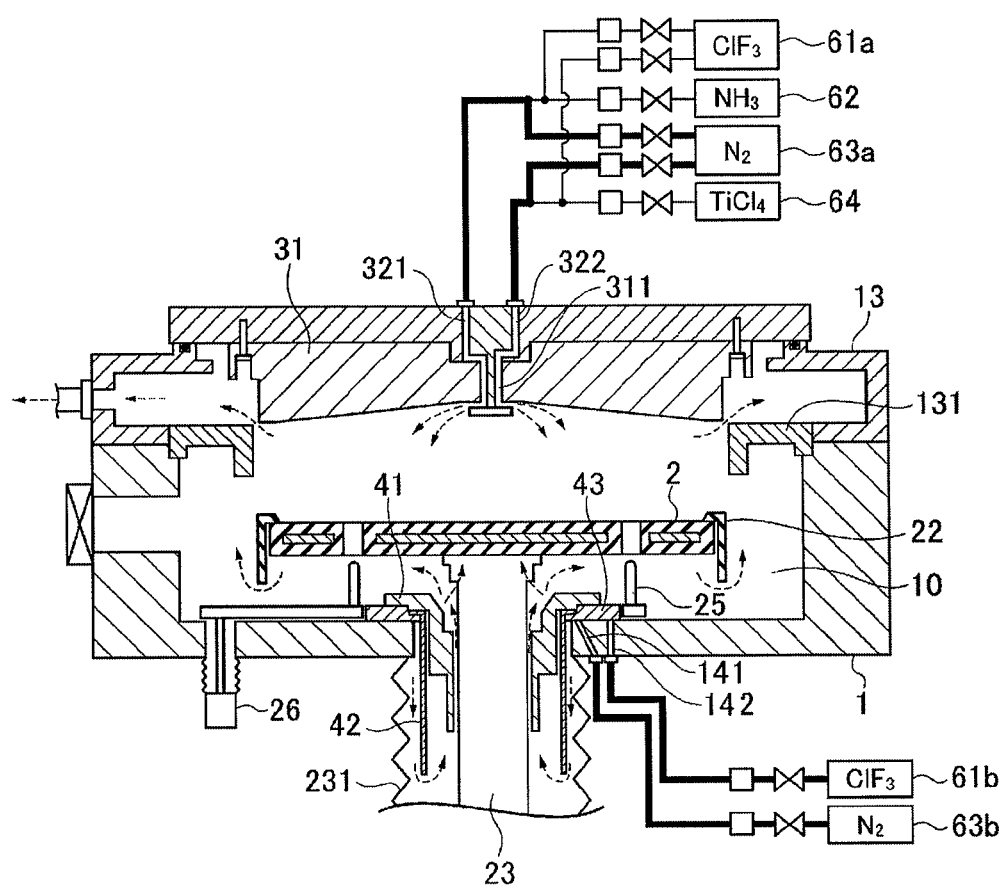
FIG. 12 is an explanatory view of a third action of the cleaning operation of the film formation device.

After the supply of the cleaning gas from the upper surface side of the mounting stand 2 in the processing position is performed for a predetermined time, the supply of the cleaning gas from the gas supply path 311 is stopped and the mounting stand 2 is moved to the lower side of the processing position (see FIG. 12). Then, the setting value of the internal pressure of the processing vessel 1 is set at, e.g., 533.3 Pa (4 Torr) which falls within a range of 66.7 to 666.6 Pa (0.5 to 5 Torr) and which is higher than the pressure available when the cleaning gas is supplied from the upper surface side.

In addition, the flow rate of the nitrogen gas supplied from the side of the bellows 231 is adjusted to, e.g., 1,900 sccm which falls within a range of 100 to 5,000 sccm, while the cleaning gas is supplied from the cleaning gas supply source 61*b* at a flow rate of, e.g., 400 sccm which falls within a range of 5 to 1,000 sccm. If the nitrogen gas and the cleaning gas are simultaneously supplied in this way, as illustrated in FIG. 4, the cleaning gas is ejected radially inward from the cleaning gas ejection holes 413 of the lid member 41 toward the elevating shaft 23. Then, the cleaning gas is merged with the flow of the nitrogen gas, which is ejected through the gap between the elevating shaft 23 and the lid member 41 so as to surround the lateral circumferential surface of the elevating shaft 23 in a sheath shape, and is diffused upward along the extension direction of the elevating shaft 23.

Thus, the cleaning gas moving upward along the elevating shaft 23 reaches the lower surface of the mounting stand 2 supported by the elevating shaft 23 and spreads radially outward along the mounting stand 2 (see FIG. 12). As a result, it is possible to bring the cleaning gas into contact with the lower surface-side-region of the mounting stand 2 to which the cleaning gas is not sufficiently spread by the supply of the cleaning gas from the upper surface side. This makes it possible to remove the reaction product of the lower surface-side-region. The height position of the mounting stand 2 when performing the cleaning of the lower surface side is not limited to the delivery position of the wafer W indicated by a single-dot chain line in FIG. 1. The cleaning may be performed in a height position which is close to the ejection position of the cleaning gas and which is lower than the delivery position.

It can be said that during the time period in which the cleaning gas is supplied from the lower surface side of the mounting stand 2, a diffusion gas for diffusing the cleaning gas is supplied to the gap between the elevating shaft 23 and the lid member 41 from the purge gas supply part (the nitrogen gas supply source 63*b*, the nitrogen gas supply path 141, the nitrogen gas flow path 435, the nitrogen gas ejection holes 432, etc.). The diffusion-purpose nitrogen gas serves also as a dilution gas which dilutes the cleaning gas.

Figure 2:
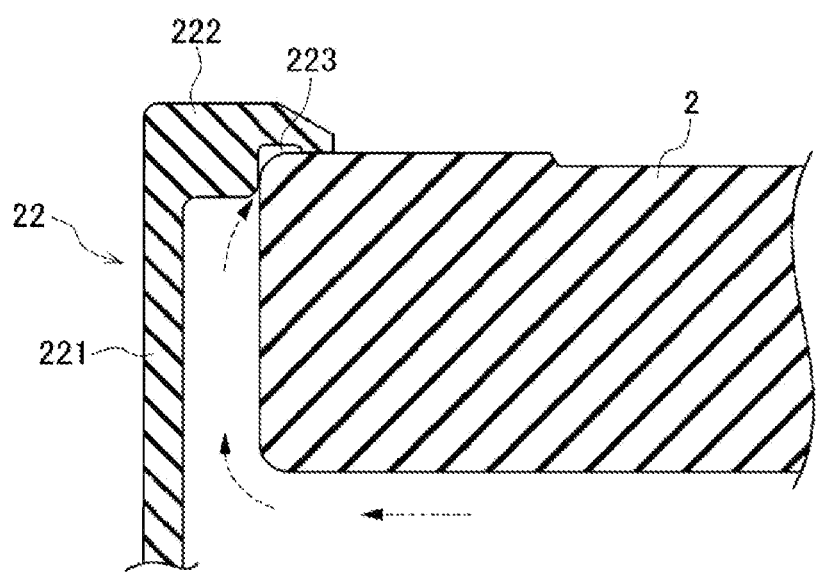
FIG. 2 is an enlarged vertical sectional view of a mounting stand installed within the film formation device.

Since the internal pressure of the processing vessel 1 when supplying the cleaning gas from the lower surface side of the mounting stand 2 is set higher than the internal pressure of the processing vessel 1 when supplying the cleaning gas from the upper surface side of the mounting stand 2, it is possible to allow the cleaning gas to sufficiently enter the gap between the mounting stand 2 and the mounting stand cover member 22, thereby reducing the region where the reaction product is not sufficiently removed. Particularly, as illustrated in FIG. 2, the cleaning gas is supplied at a high pressure from the lower surface side to the groove portion 223 existing at the lower surface side of the bent portion 222 which makes contact with the mounting stand 2. This enables the cleaning gas to easily enter the groove portion 223. In the case where the mounting stand cover member 22 not including the groove portion 223 is used as in the related art, it is impossible to clean the contact area between the mounting stand 2 and the bent portion 222. In contrast, it was experimentally confirmed that the use of the mounting stand cover member 22 having the groove portion 223 makes it possible to remove the reaction product formed in the contact area.

In this regard, the reaction of the cleaning gas and the reaction product is often an exothermic reaction. An increase of a reaction pressure during the cleaning leads to an increase of a component temperature attributable to an increase of reaction heat. Accordingly, the supply of the cleaning gas to the upper surface side of the mounting stand 2 having a large amount of reaction product is performed under a condition of relatively low pressure, thereby suppressing the increase of the component temperature. After the cleaning of the upper surface side, the amount of the reaction product existing within the processing vessel 1 is reduced to some extent. Therefore, even if the cleaning pressure is increased, the increase of the component temperature is small. Accordingly, it is possible to perform effective cleaning by increasing the cleaning pressure at the timing of supply of the cleaning gas to the lower surface side of the mounting stand 2 at which the cleaning gas is caused to enter the region where the reaction product is difficult to remove.

At the aforementioned timing at which cleaning is performed by supplying the cleaning gas from the lower surface side of the mounting stand 2, the nitrogen gas is supplied from the gas supply path 311 into the processing vessel 1 at the side of the top plate portion 31. This is to prevent the gas (containing decomposed components of the reaction product) existing within the processing vessel 1 from entering the gas supply path 311, the ammonia supply path 321 and the titanium tetrachloride supply path 322 which have been cleaned, thereby keeping the supply paths 311, 321 and 322 in a clean state. Accordingly, during this time period, the gas supply path 311, the ammonia supply path 321, titanium tetrachloride supply path 322, the nitrogen gas supply source 63a and the like play a role as an upper-side inert gas supply part of the present embodiment.

Figure 13:
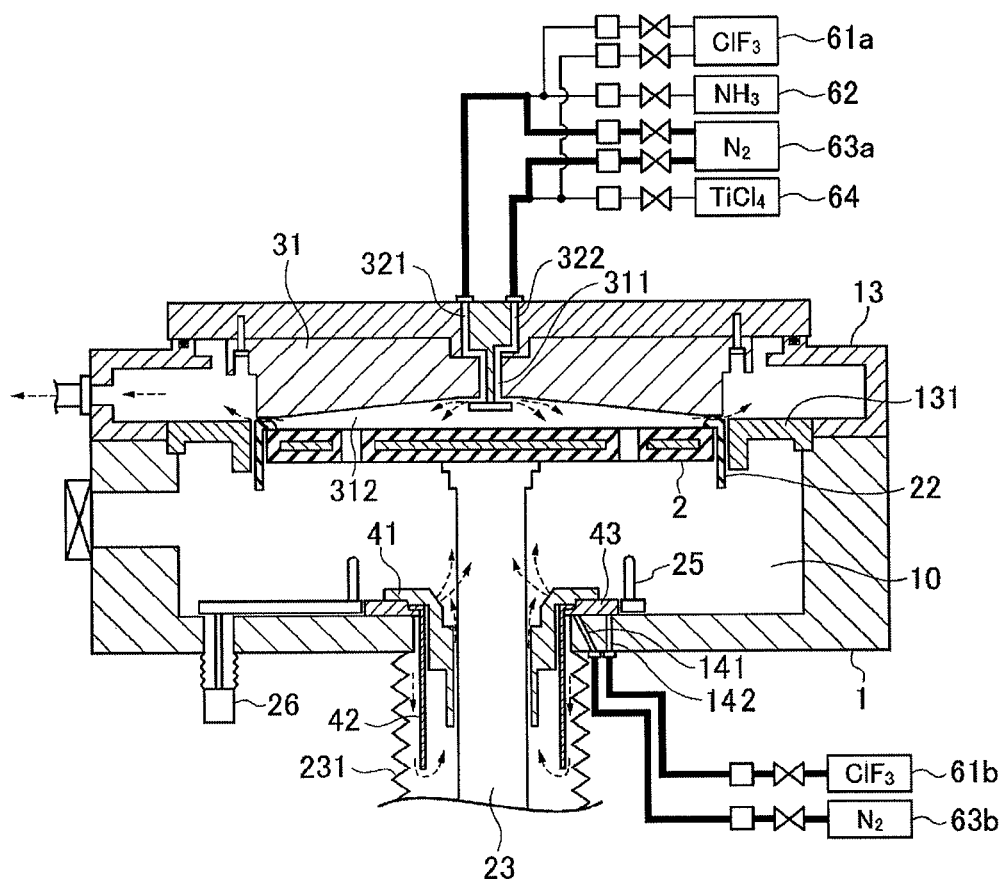
FIG. 13 is an explanatory view of a fourth action of the cleaning operation of the film formation device.

After the cleaning is performed for a predetermined time in the state illustrated in FIG. 12 as described above, the mounting stand 2 is moved to the processing position without changing the setting of the internal pressure of the processing vessel 1 and the supply amounts of the cleaning gas, the diffusion gas and the nitrogen gas supplied from the side of the top plate portion 31 (see FIG. 13). Thus, the elevating shaft 23 which has been disposed at the side of the bellows 231 is exposed to the interior of the processing vessel 1. This makes it possible to perform the cleaning of the relevant region. Even in this case, if the conductance of the gap between the mounting stand 2 and the inner ring 131 is reduced and the pressure of the bottom area 10 is increased by moving the mounting stand 2 to the processing position, the supply amount of the nitrogen gas supplied from the side of the bellows 231 may be appropriately reduced. In addition, the gap between the mounting stand 2 and the inner ring 131 may be increased by moving the mounting stand 2 to a position slightly lower than the processing position.

The film formation device according to the present embodiment provides the following effects. In addition to the first cleaning gas supply part (the gas supply path 311, the ammonia supply path 321, the titanium tetrachloride supply path 322, the cleaning gas supply source 61a, etc.) which supplies the cleaning gas into the processing vessel 1 from the upper surface side of the mounting stand 2 on which the wafer W is mounted, there is provided a second cleaning gas supply part (the cleaning gas introduction paths 415, the connection flow paths 431, the cleaning gas flow path 434, the cleaning gas supply path 142, the cleaning gas supply source 61b, etc.) which supplies the cleaning gas toward the lower surface of the mounting stand 2 along the elevating shaft 23 that supports the mounting stand 2 at the lower surface side thereof. For that reason, it is possible to directly supply the cleaning gas toward the lower surface of the mounting stand 2 where the cleaning gas supplied from the first cleaning gas supply part is difficult to reach. This makes it possible to effectively clean the relevant region.

In this regard, the supply order of the cleaning gas from the first and second cleaning gas supply parts and the position of the mounting stand 2 during the cleaning are not limited to those described with reference to FIGS. 10 to 13 but may be appropriately changed. Furthermore, it is not essential that the cleaning is performed by sequentially supplying the cleaning gas from the first and second cleaning gas supply parts as in the example described with reference to FIGS. 10 to 13. For example, after the cleaning gas is simultaneously supplied from the first and second cleaning gas supply parts while lowering the mounting stand 2 to a position lower than the processing position, the mounting stand 2 may be moved to the processing position. Subsequently, the cleaning of the upper surface side and the lower surface side may be simultaneously performed to shorten the cleaning time. At this time, the internal pressure of the processing vessel 1 when the mounting stand 2 is lowered to the position lower than the processing position may be set higher than the internal pressure of the processing vessel 1 when the mounting stand 2 is moved to the processing position, thereby facilitating the cleaning of the peripheral edge portion of the mounting stand 2 through the groove portion 223 of the mounting stand cover member 22. It is also not essential that the cleaning is performed by moving the mounting stand 2 to the position lower than the processing position and to the processing position. For example, the mounting stand 2 may be moved to the position lower than the processing position and may be fixed in that position. In this state, the cleaning gas may be sequentially or simultaneously supplied from the first and second cleaning gas supply parts.

The configuration of the top plate portion 31 is not limited to the example illustrated in FIG. 1 and other figures. For example, the reaction gases or the substitution gas may be directly supplied from the opening portion 315 not including the diffusion plate 33. Instead of using the diffusion plate 33, the opening portion 315 may be covered with a flat bowl-shaped member having a plurality of gas supply holes. In addition, instead of using the top plate portion 31 having the recess portion, a shower-head-type top plate portion 31 having a plurality of gas supply holes distributed on the entire surface of the top plate portion 31 having a flat lower surface may be disposed to face the mounting stand 2.

Next, descriptions will be made on the variations of the second cleaning gas supply part. The method of supplying the cleaning gas to the lower surface side of the mounting stand 2 along the elevating shaft 23 is not limited to the case where, as in the example illustrated in FIG. 4, the cleaning gas is merged with and diffused by the diffusion gas flowing along the lateral circumferential surface of the elevating shaft 23. For example, gas ejection holes for ejecting the cleaning gas may be formed on the bottom surface of the processing vessel 1 around the elevating shaft 23, and the cleaning gas may be supplied upward from the gas ejection holes along the elevating shaft 23.

As for the components disposed within the processing vessel 1, it is not essential to install the inner ring 131. The space (the processing space 312, etc.) existing above the mounting stand 2 positioned in the processing position may be brought into communication with the bottom area 10. The exhaust position in which exhaust is performed by the vacuum exhaust part is not limited to the example illustrated in FIG. 1 and other figures where exhaust is performed from the lateral side of the gap between the top plate portion 31 and the mounting stand 2. The exhaust port 132 may be formed at the side of a ceiling portion of the exhaust duct 13. In the case where the inner ring 131 is not used, the exhaust port 132 may be formed on the sidewall surface of the processing vessel 1 positioned lower than the mounting stand 2 existing in the processing position. The inert gas used as the purge gas is not limited to the nitrogen gas, but an argon gas or a helium gas may be used as the purge gas.

The film formation device may form not only the TiN film described above but also a film containing a metal element, e.g., Al, Si or the like which is an element of the third period of the periodic table, Ti, Cr, Mn, Fe, Co, Ni, Cu, Zn, Ge or the like which is an element of the fourth period of the periodic table, Zr, Mo, Ru, Rh, Pd, Ag or the like which is an element of the fifth period of the periodic table, and Ba, Hf, Ta, W, Re, Ir, Pt or the like which is an element of the sixth period of the periodic table. Examples of the metal element adsorbed to the surface of the wafer W include organic metal compounds or inorganic metal compounds of the aforementioned metal elements which are used as the reaction gases (raw material gases). Specific examples of the metal element may include not only $TiCl_4$ mentioned above but also BTBAS ((bistertial butylamino) silane), DCS (dichlorosilane), HCD (hexadichlorosilane), TMA (trimethyl aluminum) and 3DMAS (trisdimethylaminosilane). The kind of the cleaning gas is appropriately selected depending on the kind of a film to be formed. A halogen-based gas such as $F_2$ or the like may be used as the cleaning gas.

As the reaction for obtaining a desired film by reacting the raw material gases adsorbed to the surface of the wafer W, it may be possible to use various kinds of reactions, e.g., an oxidizing reaction which makes use of $O_2$, $O_3$, $H_2O$ or the like, a reducing reaction which makes use of an organic acid such as $H_2$, HCOOH, $CH_3COOH$ or the like or an alcohol such as $CH_3OH$, $C_2H_5OH$ or the like, a carbonizing reaction which makes use of $CH_4$, $C_2H_6$, $C_2H_4$, $C_2H_2$ or the like, and a nitriding reaction which makes use of $NH_3$, $NH_2NH_2$, $N_2$ or the like.

As the reaction gases, it may be possible to use three kinds of reaction gases or four kinds of reaction gases. In the meantime, the method of forming a film on the surface of the wafer W is not limited to the ALD method. The present disclosure may be applied to a film formation device which performs various kinds of CVD methods such as, e.g., a thermal CVD method in which a thin film is obtained by continuously supplying a metal source into the processing vessel 1 and decomposing the metal source on the surface of the heated wafer W, and a plasma CVD method in which continuous film formation is performed by activating and reacting a metal source and a reaction gas under the presence of plasma.

EXPLANATION OF REFERENCE NUMERALS

W: wafer W, 1: processing vessel, 15: through-hole, 2: mounting stand, 31: top plate portion, 141: nitrogen gas supply path, 23: elevating shaft, 231: bellows, 232: elevating plate, 41, 41a or 41b: lid member, 412: recess portion, 417: sleeve, 42: tubular member, 43: ring member, 63a or 63b: nitrogen gas supply source

What is claimed is:
1. A film formation device, comprising:
a processing vessel configured to perform a film formation process by supplying a reaction gas to a surface of a substrate under a vacuum atmosphere;
a mounting stand installed within the processing vessel and configured to mount the substrate thereon;
an elevating shaft installed so as to extend in an up-down direction while supporting the mounting stand at a lower surface side of the mounting stand and connected to an elevator mechanism through a through-hole formed in the processing vessel, the elevator mechanism being configured by a motor disposed outside the processing vessel;
a bellows installed between the processing vessel and the elevator mechanism and configured to cover a periphery of the elevating shaft at a lateral side of the elevating shaft;
a lid member having a cylindrical portion and a flange portion located at an upper end of the cylindrical portion, the cylindrical portion of the lid member being disposed so as to surround the elevating shaft with a gap left between a lateral circumferential surface of the elevating shaft and the lid member and the flange portion of the lid member being attached to the processing vessel over a circumference of the through-hole of the processing vessel so that communication between a space below the lid member and a space above the lid member is prevented in regions other than the gap;
a purge gas supply part that supplies a purge gas from a purge gas supply source into the bellows via a purge gas flow path formed in the purge gas supply part, so that a gas flow from the bellows toward the processing vessel through the gap between the elevating shaft and the lid member is formed; and
a tubular member having a cylindrical body portion and a flange portion located at an upper end of the cylindrical body portion, the cylindrical body portion of the tubular member being disposed, with the flange portion of the tubular member attached to the processing vessel over the circumference of the through-hole of the processing vessel, between an outer circumferential surface of the cylindrical portion of the lid member and an inner circumferential surface of the bellows and extending more downward than a lower end portion of the lid member,
wherein the tubular member is disposed so that a gap is formed between an outer circumferential surface of the tubular member and the inner circumferential surface of the bellows, and the purge gas supply part is configured to supply the purge gas into the bellows from an upper position within the gap between the tubular member and the bellows.

2. The device of claim 1, wherein a height dimension of an inner circumferential surface of the lid member which surrounds the elevating shaft through the gap is larger than a height dimension of an inner circumferential surface of the through-hole.

3. The device of claim 2, wherein the lid member includes a sleeve configured to increase the height dimension of the inner circumferential surface of the lid member which surrounds the elevating shaft.

4. The device of claim 1, wherein the mounting stand includes a heater embedded in the mounting stand and configured to heat the substrate, and a recess portion configured to increase a distance between the heater and the lid member is formed on an upper surface of the lid member so that a temperature rise of the lid member attributable to heat dissipation from the heater is suppressed.

5. The device of claim 1, further comprising:
an inner ring disposed so as to surround the mounting stand with a gap left between the inner ring and a lateral circumferential surface of the mounting stand staying in a position where the film formation process is performed, and configured to divide an interior of the processing vessel into an upper processing space into which the reaction gas is supplied and a lower space; and a vacuum pump configured to evacuate the interior of the processing vessel from the side of the processing space, wherein the purge gas flowing through the gap between the elevating shaft and the lid member is introduced into the lower space.

6. The device of claim 1, wherein the processing vessel includes a top plate portion facing the mounting stand so as to define, between the top plate portion and the mounting stand, a processing space in which the film formation process is performed by diffusing the reaction gas, and provided with a gas supply hole through which the reaction gas is supplied from a reaction gas supply source to the processing space, wherein the elevator mechanism is configured to move the mounting stand up and down through the elevating shaft between a processing position which forms the processing space and a position which is lower than the processing position, and wherein the device further comprises:
a first cleaning gas supply part that supplies a first cleaning gas from a first cleaning gas supply source to an upper surface side of the mounting stand via a first cleaning gas supply path formed in the first cleaning gas supply part; and
a second cleaning gas supply part that supplies a second cleaning gas from a second cleaning gas supply source to the lower surface side of the mounting stand along the elevating shaft via a second cleaning gas supply path formed in the second cleaning gas supply part.

7. The device of claim 6, further comprising:
controller that outputs a control signal so that the second cleaning gas supply part supplies the second cleaning gas in a state in which the mounting stand is moved down to a position lower than the processing position.

8. The device of claim 7, wherein the controller outputs a control signal so that the second cleaning gas supply part supplies the second cleaning gas in a state in which the mounting stand is moved up to the processing position.

9. The device of claim 7, further comprising:
an upper inert gas supply part configured to supply an inert gas to the gas supply hole formed in the top plate portion,
wherein the controller outputs a control signal so that, during the supply of the second cleaning gas from the second cleaning gas supply part, the inert gas is supplied from the upper inert gas supply part into the processing vessel through the gas supply hole.

10. The device of claim 6, further comprising:
a controller that outputs a control signal so that the first cleaning gas supply part supplies the first cleaning gas in a state in which the mounting stand is moved down to a position lower than the processing position.

11. The device of claim 10, wherein the controller outputs a control signal so that the first cleaning gas supply part supplies the first cleaning gas in a state in which the mounting stand is moved up to the processing position.

12. The device of claim 10, wherein the purge gas supply part is configured to supply an inert gas, and the controller outputs a control signal so that, during the supply of the first cleaning gas from the first cleaning gas supply part, the inert gas is supplied from the purge gas supply part into the processing vessel.

13. The device of claim 6, wherein the second cleaning gas supply part is configured to use, as a diffusion gas, the purge gas supplied from the purge gas supply part and supplies the second cleaning gas to a position where the second cleaning gas is diffused to the lower surface side of the mounting stand while riding on a flow of the diffusion gas.

14. The device of claim 6, wherein the first cleaning gas supply part supplies the first cleaning gas into the processing vessel through the gas supply hole formed in the top plate portion.

15. The device of claim 6, wherein the mounting stand includes an annular cover member having a flat cylindrical tube portion, which has an opened upper and lower ends, and a bent portion bent inward from the upper end of the cylindrical tube portion over a circumferential direction of the cylindrical tube portion, the bent portion being locked to an upper-surface-side peripheral edge portion of the mounting stand so that the cover member surrounds a lateral circumferential surface of the mounting stand at a lateral side of the mounting stand with a gap left between the cover member and the mounting stand, and wherein a groove portion configured to allow the first and second cleaning gases to enter the groove portion is formed in a portion of the cover member where the cover member makes contact with the upper-surface-side peripheral edge portion of the mounting stand.

16. The device of claim 6, further comprising:
a controller that outputs a control signal so that the supply of the first and second cleaning gases is performed within the processing vessel evacuated by the vacuum pump and so that the supply of the second cleaning gas from the second cleaning gas supply part is performed under a pressure higher than a pressure available during the supply of the first cleaning gas from the first cleaning gas supply part.

17. The device of claim 6, wherein the vacuum pump is configured to perform a gas evacuation from the processing space to a lateral side through a gap between the mounting stand and the top plate portion.

* * * * *

UNITED STATES PATENT AND TRADEMARK OFFICE
CERTIFICATE OF CORRECTION

PATENT NO. : 10,221,478 B2
APPLICATION NO. : 14/787860
DATED : March 5, 2019
INVENTOR(S) : Kensaku Narushima et al.

It is certified that error appears in the above-identified patent and that said Letters Patent is hereby corrected as shown below:

In the Claims

Claim 7, Column 21, Line 37, please delete the phrase "controller that outputs" and replace with "a controller that outputs".

Signed and Sealed this
Twenty-third Day of April, 2019

Andrei Iancu
*Director of the United States Patent and Trademark Office*